(12) United States Patent
Park et al.

(10) Patent No.: US 12,512,069 B2
(45) Date of Patent: Dec. 30, 2025

(54) SOURCE PRINTED CIRCUIT BOARD AND DISPLAY DEVICE

(71) Applicant: LG Display Co., Ltd., Seoul (KR)

(72) Inventors: ChulWoo Park, Paju-si (KR); KyungHoon Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 18/882,307

(22) Filed: Sep. 11, 2024

(65) Prior Publication Data
US 2025/0104652 A1 Mar. 27, 2025

(30) Foreign Application Priority Data
Sep. 21, 2023 (KR) .................. 10-2023-0126495

(51) Int. Cl.
*G09G 3/3275* (2016.01)
*H05K 1/11* (2006.01)

(52) U.S. Cl.
CPC .......... *G09G 3/3275* (2013.01); *H05K 1/111* (2013.01); *G09G 2330/023* (2013.01); *G09G 2330/045* (2013.01); *H05K 2201/09681* (2013.01)

(58) Field of Classification Search
CPC .......... G09G 3/3275; G09G 2330/023; G09G 2330/045; H05K 1/111; H05K 2201/09681; H05K 1/02; H05K 1/0298; H05K 1/03; H05K 1/0201; H05K 1/115; H05K 1/147; G09F 9/335; G09F 9/35; G02F 1/133302; G02F 1/13452; H10K 59/131; H10K 77/10
See application file for complete search history.

(56) References Cited

U.S. PATENT DOCUMENTS

| | | | |
|---|---|---|---|
| 10,244,629 B1 * | 3/2019 | Balasubramanian | H05K 1/113 |
| 11,160,160 B1 * | 10/2021 | Berkel | H01L 23/13 |
| 12,309,922 B1 * | 5/2025 | Liang | H05K 3/4038 |
| 2011/0138619 A1 * | 6/2011 | Dayan | H01P 11/003 29/830 |
| 2016/0165723 A1 * | 6/2016 | Romero | H01L 23/49827 174/251 |
| 2016/0180756 A1 * | 6/2016 | Go | G02F 1/13452 345/33 |
| 2016/0323995 A1 * | 11/2016 | Yi | H05K 1/115 |
| 2018/0063970 A1 * | 3/2018 | Ha | H05K 1/111 |
| 2020/0245451 A1 * | 7/2020 | Chandra | H05K 1/116 |
| 2021/0167328 A1 * | 6/2021 | Kim | H10K 77/111 |
| 2023/0007766 A1 * | 1/2023 | Yang | H05K 1/0266 |
| 2023/0341458 A1 * | 10/2023 | Chen | G01R 1/07 |
| 2024/0080978 A1 * | 3/2024 | Farkas | H05K 3/4038 |
| 2024/0098894 A1 * | 3/2024 | Kim | H05K 1/111 |

* cited by examiner

*Primary Examiner* — Ibrahim A Khan
(74) *Attorney, Agent, or Firm* — Fenwick & West LLP

(57) ABSTRACT

A source printed circuit board and a display device including the source printed circuit board are disclosed. The source printed circuit board includes a second copper plate layer that includes a mesh area corresponding to a pad area, an air hole is disposed in the lower part of a third copper plate layer corresponding to the pad area, and a back drill through hole connected to the second copper plate layer and the third copper plate layer is not connected to a first copper plate layer, thereby maintaining the bonding temperature.

16 Claims, 11 Drawing Sheets

SOURCE PRINTED CIRCUIT BOARD AND DISPLAY DEVICE

CROSS REFERENCE TO RELATED APPLICATION

This application claims priority to Republic of Korea Patent Application No. 10-2023-0126495, filed on Sep. 21, 2023, which is hereby incorporated by reference herein in its entirety.

TECHNICAL FIELD

Embodiments of the present disclosure relate to a source printed circuit board and a display device.

BACKGROUND

As the information society develops, there is increasing the demand for display devices for displaying images in various forms. Therefore, in recent years, there have been used various display devices such as liquid crystal displays and organic light emitting display devices.

A display device may include a display panel, a driving circuit, a control unit, etc. The driving circuit may include a data driving circuit and a gate driving circuit. The control unit may be a timing controller.

The driving circuit and the control unit may each be disposed on a printed circuit board.

A display device may be manufactured by combining a printed circuit board on which a driving circuit is disposed and a printed circuit board on which a control unit is disposed.

The process for combining the printed circuit boards may be referred to as a bonding process. When the bonding process proceeds, heat may be applied to a bonding area having an anisotropic conductive film (ACF).

SUMMARY

Heat may be applied to a bonding area during bonding the printed circuit boards.

In this case, if the heat is not maintained above a certain temperature, there may be problems that complete bonding is not possible.

Embodiments of the present disclosure may provide a source printed circuit board and a display device capable of maintaining a bonding temperature.

Embodiments of the present disclosure may provide a source printed circuit board and a display device capable of preventing or at least reducing heat from a bonding area from being transferred to an unnecessary area.

Embodiments of the present disclosure may provide a source printed circuit board and display device capable of low power consumption by preventing or at least reducing heat from the bonding area from being transferred to unnecessary areas.

A source printed circuit board according to embodiments of the present disclosure may include a source printed circuit board including a first copper plate layer disposed on a first substrate layer, a second substrate layer disposed on the first copper plate layer, a second copper plate layer disposed on the second substrate layer, a third substrate layer disposed on the second copper plate layer, and a third copper plate layer disposed on the third substrate layer, wherein the third copper plate layer includes a plurality of pad portions disposed in a pad area, wherein the second copper plate layer includes a mesh area corresponding to the pad area, wherein an air hole is disposed in a lower part of the third copper plate layer corresponding to the pad area, and wherein a back drill through hole connected to the second copper plate layer and the third copper plate layer is not connected to the first copper plate layer.

A display device according to embodiments of the present disclosure may include a display panel, a source film connected to the display panel, and a source printed circuit board connected to the source film, wherein the source printed circuit board includes a first copper plate layer disposed on a first substrate layer, a second substrate layer disposed on the first copper plate layer, a second copper plate layer disposed on the second substrate layer, a third substrate layer disposed on the second copper plate layer, and a third copper plate layer disposed on the third substrate layer, wherein the third copper plate layer includes a plurality of pad portions disposed in a pad area, wherein the second copper plate layer includes a mesh area corresponding to the pad area, wherein an air hole is disposed in a lower part of the third copper plate layer corresponding to the pad area, and wherein a back drill through hole connected to the second copper plate layer and the third copper plate layer is not connected to the first copper plate layer.

According to embodiments of the present disclosure, there may be a source printed circuit board and a display device capable of maintaining a bonding temperature.

According to embodiments of the present disclosure, there may be a source printed circuit board and a display device capable of preventing or at least reducing heat from a bonding area from being transferred to an unnecessary area.

According to embodiments of the present disclosure, there may be a source printed circuit board and display device capable of low power consumption by preventing or at least reducing heat from the bonding area from being transferred to unnecessary areas.

DETAILED DESCRIPTION

Figure 1:
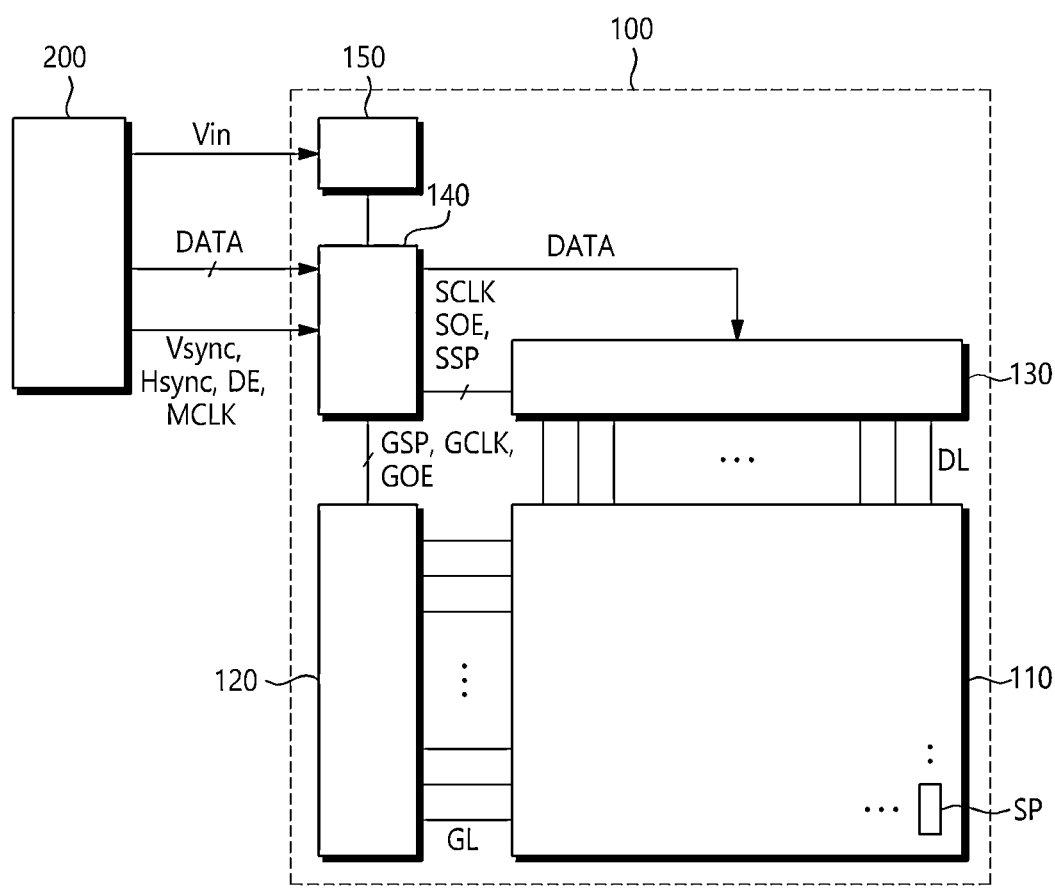
FIG. 1 illustrates a schematic configuration of a display device according to embodiments of the present disclosure.

In the following description of examples or embodiments of the present disclosure, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the present disclosure, detailed descriptions of well-known functions and components incorporated herein will be omitted when it is determined that the description may make the subject matter in some embodiments of the present disclosure rather unclear. The terms such as "including", "having", "containing", "constituting", "make up of", and "formed of" used herein are generally intended to allow other components to be added unless the terms are used with the term "only". As used herein, singular forms are intended to include plural forms unless the context clearly indicates otherwise.

Terms, such as "first", "second", "A", "B", "(A)", or "(B)" may be used herein to describe elements of the present disclosure. Each of these terms is not used to define essence, order, sequence, or number of elements etc., but is used merely to distinguish the corresponding element from other elements.

When it is mentioned that a first element "is connected or coupled to", "contacts or overlaps" etc. a second element, it should be interpreted that, not only can the first element "be directly connected or coupled to" or "directly contact or overlap" the second element, but a third element can also be "interposed" between the first and second elements, or the first and second elements can "be connected or coupled to", "contact or overlap", etc. each other via a fourth element. Here, the second element may be included in at least one of two or more elements that "are connected or coupled to", "contact or overlap", etc. each other.

When time relative terms, such as "after," "subsequent to," "next," "before," and the like, are used to describe processes or operations of elements or configurations, or flows or steps in operating, processing, manufacturing methods, these terms may be used to describe non-consecutive or non-sequential processes or operations unless the term "directly" or "immediately" is used together.

In addition, when any dimensions, relative sizes etc. are mentioned, it should be considered that numerical values for elements or features, or corresponding information (e.g., level, range, etc.) include a tolerance or error range that may be caused by various factors (e.g., process factors, internal or external impact, noise, etc.) even when a relevant description is not specified. Further, the term "may" fully encompasses all the meanings of the term "can".

Hereinafter, various embodiments of the disclosure are described in detail with reference to the accompanying drawings.

FIG. 1 illustrates a schematic configuration of a display device 100 according to embodiments of the present disclosure.

Referring to FIG. 1, a display device 100 according to embodiments of the present disclosure may include a display panel 110 in which a plurality of gate lines GL and data lines DL are disposed and a plurality of subpixels SP are arranged in a matrix form, a gate driving circuit 120 for driving the plurality of gate lines GL, a data driving circuit 130 for supplying data voltage through the plurality of data lines DL, a controller 140 for controlling the data driving circuit 120 and the data driving circuit 130, and a power management circuit 150.

The display panel 110 may display the image based on a scan signal transmitted from the gate driving circuit 120 through a plurality of gate lines GL and a data voltage transmitted from the data driving circuit 130 through a plurality of data lines DL.

In the case of an organic light emitting display, the display panel 110 may be implemented as a top emission method, a bottom emission method, or a dual emission method.

The display panel 110 may include a plurality of pixels arranged in a matrix form, and each pixel may include subpixels SP of different colors, for example, a white subpixel, a red subpixel, a green subpixel, and a blue subpixel. In addition, each subpixel SP may be defined by a plurality of data lines DL and a plurality of gate lines GL.

One subpixel SP may include a thin film transistor TFT formed in the area where one data line DL and one gate line GL intersect, a light emitting device such as an organic light emitting diode which charges the data voltage, and a storage capacitor electrically connected to the light emitting device to maintain a voltage.

For example, in the case that a display device 100 with a resolution of 2160×3840 includes four subpixels of white (W), red (R), green (G), and blue (B), there may be 2,160 gate lines GL and a total of 3,840×4=15,360 data lines DL by and 3,840 data lines DL each connected to 4 subpixels (WRGB). A subpixel SP may be disposed at each point where the gate line GL and the data line DL intersect.

The gate driving circuit 120 may be controlled by the controller 140, and sequentially output scan signals to a plurality of gate lines GL arranged on the display panel 110 to control the driving timing for a plurality of subpixels SP.

In this case, the gate driving circuit 120 may include one or more gate driving integrated circuits GDIC, and may be located only on one side of the display panel 110 or may be located on both sides of the display panel 110 depending on the driving method. Alternatively, the gate driving circuit 120 may be embedded in a bezel area of the display panel 110 to be implemented in a gate-in-panel (GIP) type.

The data driving circuit 130 may receive image data DATA from the controller 140, and convert the received image data DATA into an analog data voltage. Then, the data driving circuit 130 may output a data voltage to each data line DL in accordance with the timing of applying the scan signal through the gate line GL, so that each subpixel SP connected to the data line DL may display a light with brightness corresponding to the data voltage.

Similarly, the data driving circuit 130 may include one or more source driving integrated circuits SDICs, and the source driving integrated circuit SDIC may be connected to a bonding pad of the display panel 110 using a tape automated bonding (TAB) method or a chip-on-glass (COG) method, or may be disposed directly on the display panel 110.

Depending on the case, each source driving integrated circuit SDIC may be integrated and disposed on the display panel 110. In addition, each source driving integrated circuit SDIC may be implemented in a chip-on-film (COF) method. In this case, each source driving integrated circuit SDIC may be mounted on a circuit film, and may be electrically connected to the data line DL of the display panel 110 through a circuit film.

The controller 140 may supply various control signals to the gate driving circuit 120 and the data driving circuit 130, and control the operations of the gate driving circuit 120 and the data driving circuit 130. That is, the controller 140 may control the gate driving circuit 120 to output a scan signal according to the timing implemented in each frame, and may transmit image data DATA received from the outside to the data driving circuit 130.

In this case, the controller 140 may receive image data DATA and various timing signals, including a vertical synchronization signal Vsync, a horizontal synchronization signal Hsync, a data enable DE signal, and a main clock MCLK from the external host system 200.

The host system 200 may be any one of a television system, a set-top box, a navigation system, a personal computer (PC), a home theater system, a mobile device, and a wearable device.

Accordingly, the controller 140 may generate a control signal using various timing signals received from the host system 200, and transmit the timing signal to the gate driving circuit 120 and the data driving circuit 130.

For example, in order to control the gate driving circuit 120, the controller 140 may output various gate control signals, including a gate start pulse signal GSP, a gate clock GCLK, and a gate output enable signal GOE. Here, the gate start pulse GSP may control the operation start timing of one or more gate driving integrated circuits GDIC constituting the gate driving circuit 120. Additionally, the gate clock GCLK is a clock signal commonly input to one or more gate driving integrated circuits GDIC, and may control the shift timing of the scan signal. Additionally, the gate output enable signal GOE may specify timing information of one or more gate driver integrated circuits GDIC.

In addition, in order to control the data driving circuit 130, the controller 140 may output various data control signals such as a source start pulse SSP, a source sampling clock SCLK, and a source output enable signal SOE. Here, the source start pulse SSP may control the timing at which one or more source driving integrated circuits SDICs constituting the data driving circuit 130 start sampling data. The source sampling clock SCLK is a clock signal which controls the timing of sampling data in a source driving integrated circuit SDIC. The source output enable signal SOE may control the output timing of the data driving circuit 130.

The display device 100 may include a power management circuit 150 which supplies various voltages or currents to the display panel 110, the gate driving circuit 120, and the data driving circuit 130, or controls the various voltages or currents to be supplied.

The power management circuit 150 may adjust the direct current input voltage Vin supplied from the host system 200 to generate the power required to drive the display panel 110, the gate driving circuit 120, and the data driving circuit 130. The power management circuit 150 may be referred to as a power management integrated circuit PMIC.

Meanwhile, the subpixel SP may be located at a point where the gate line GL and the data line DL intersect, and a light emitting device may be disposed in each subpixel SP. For example, an organic light emitting display device may include a light emitting device such as an organic light emitting diode in each subpixel SP, and may display an image by controlling the current flowing through the light emitting device according to the data voltage.

The display device 100 may be of various types such as a liquid crystal display, organic light emitting display, and plasma display panel.

Figure 2:
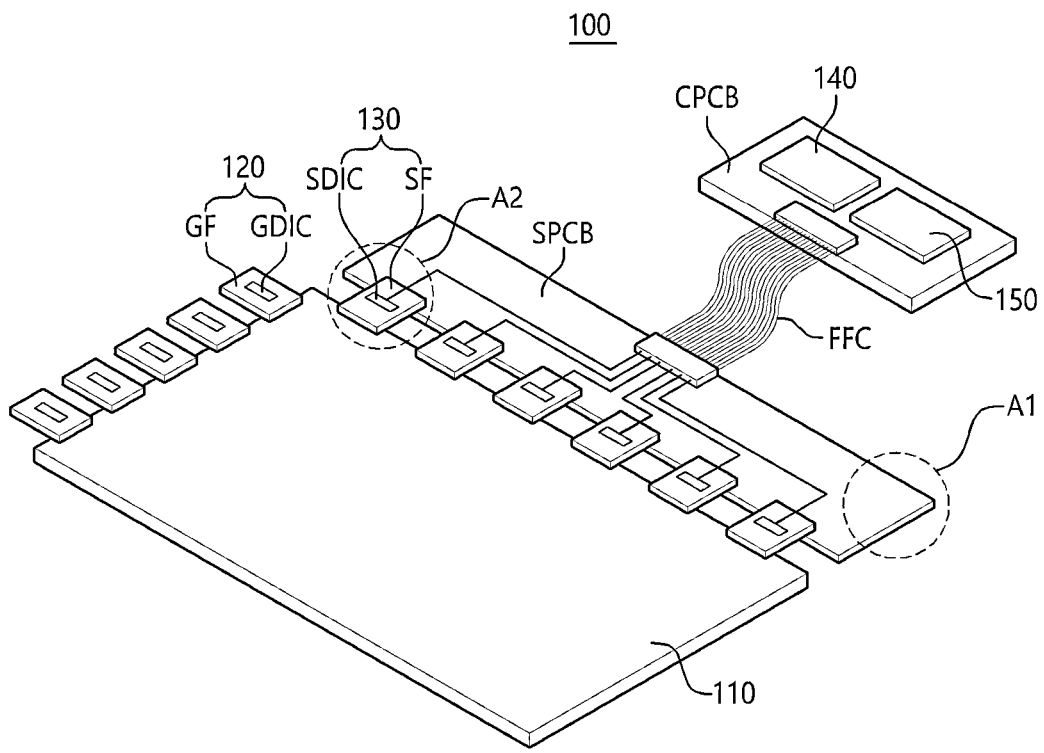
FIG. 2 is a system diagram of a display device according to embodiments of the present disclosure.

FIG. 2 is a system diagram of a display device 100 according to embodiments of the present disclosure.

FIG. 2 illustrates an example of a display device 100 according to embodiments of the present disclosure in which a source driving integrated circuit SDIC included in the data driving circuit 130 and a gate driving integrated circuit GDIC included in the gate driving circuit 120 are implemented in the chip-on-film (COF) method among various methods (TAB, COG, COF, etc.).

One or more gate driving integrated circuits GDIC included in the gate driving circuit 120 may each be mounted on a gate film GF, and one side of the gate film GF may be electrically connected to the display panel 110. In addition, there may be disposed the lines on the gate film GF for electrically connecting the gate driving integrated circuit GDIC and the display panel 110.

In this case, the gate driving circuit 120 may be located on only one side or both sides of the display panel 110 depending on the driving method. Alternatively, the gate driving circuit 120 may be embedded in the bezel area of the display panel 110, and implemented in a gate-in-panel (GIP) form.

Similarly, one or more source driving integrated circuits SDICs included in the data driving circuit 130 may each be mounted on the source film SF, and one side of the source film SF may be electrically connected to the display panel 110. Additionally, the lines for electrically connecting the source driving integrated circuit SDIC and the display panel 110 may be disposed on the source film SF.

The display device 100 may include at least one source printed circuit board SPCB and a control printed circuit board CPCB for mounting control components and various electrical devices for circuit connection between a plurality of source driving integrated circuits SDIC and other devices.

In this case, the other side of the source film SF on which the source driving integrated circuit SDIC is mounted may be connected to at least one source printed circuit board SPCB. That is, one side of the source film SF on which the source driving integrated circuit SDIC is mounted may be electrically connected to the display panel 110, and the other side may be electrically connected to the source printed circuit board SPCB.

A controller 140 and a power management circuit (e.g., power management IC) 150 may be mounted on a control printed circuit board CPCB. The controller 140 may control the operations of the data driving circuit 130 and the gate driving circuit 120. The power management circuit 150 may supply driving voltage or current to the display panel 110, the data driving circuit 130, and the gate driving circuit 120, and may control the supplied voltage or current.

At least one source printed circuit board SPCB and a control printed circuit board CPCB may be connected electrically through at least one connection member, and the connection member may be, for example, a flexible printed circuit (FPC), a flexible flat cable (FFC), etc. In this case, the connection member connecting at least one source printed circuit board SPCB and the control printed circuit board CPCB may be modified depending on the size and type of the display device 100. Additionally, at least one source printed circuit board SPCB and a control printed circuit board CPCB may be integrated and implemented as one printed circuit board.

In the case of the display device 100 configured as above, the power management circuit 150 may transfer the driving voltage required for display driving or characteristic value sensing through a flexible printed circuit (FPC) or flexible flat cable (FFC) to the source printed circuit board SPCB. The driving voltage transferred to the source printed circuit board SPCB may be is supplied to emit or sense a specific subpixel SP in the display panel 110 through the source driving integrated circuit SDIC.

Referring to FIG. 2, there may be provided a first area A1 and a second area A2 according to embodiments of the present disclosure.

Figure 3:
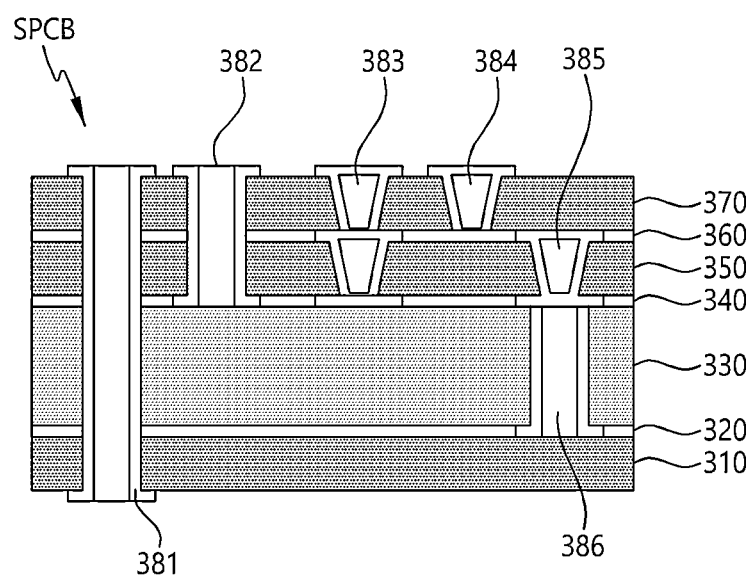
FIG. 3 is a cross-sectional view of a portion of a source printed circuit board according to embodiments of the present disclosure.

Referring to FIG. 2, there is illustrated the first area A1, which is an enlarged area of the source printed circuit board SPCB. FIG. 3 illustrates an enlarged first area A1 according to embodiments of the present disclosure.

Figure 4:
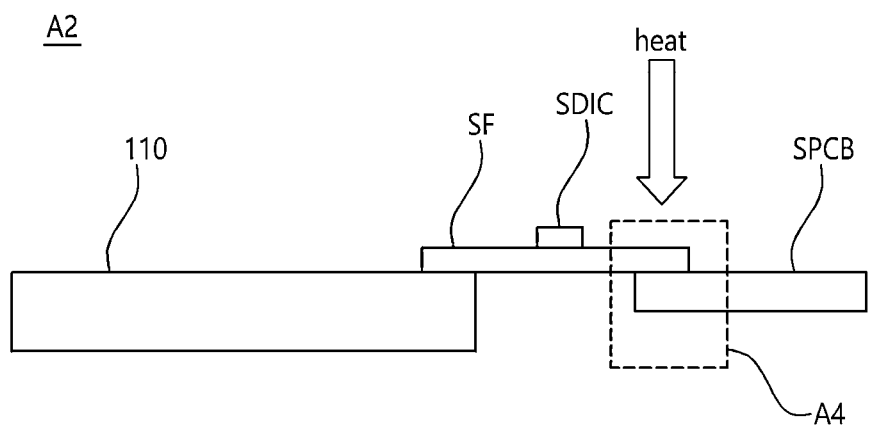
FIGS. 4 and 5 illustrate a bonding state of a source printed circuit board according to embodiments of the present disclosure.

Referring to FIG. 2, the connection state between the display panel 110, the source film SF, and the source printed circuit board SPCB in the second area A2 is illustrated. FIG. 4 illustrates an enlarged second area A2 according to embodiments of the present disclosure.

Hereinafter, it will be described the first area A1 and the second area A2.

FIG. 3 is a cross-sectional view of a portion of a source printed circuit board SPCB according to embodiments of the present disclosure.

A source printed circuit board SPCB may include a plurality of substrate layers, a plurality of copper plate layers, and a plurality of vias.

A first substrate layer 310 may be the lowest layer of a source printed circuit board SPCB. The first substrate layer 310 may be a core.

A first copper plate layer 320 may be disposed on the first substrate layer 310. The first copper plate layer 320 may include a line through which electrical signals are transmitted and a general copper plate through which electrical signals are not transmitted.

A second substrate layer 330 may be disposed on the first copper plate layer 320. The second substrate layer 330 may be a core or a prepreg.

A second copper plate layer 340 may be disposed on the second substrate layer 330. The second copper plate layer 340 may include a line through which electrical signals are transmitted and a general copper plate through which electrical signals are not transmitted.

A third substrate layer 350 may be disposed on the first copper plate layer 320. The third substrate layer 350 may be a core or a prepreg.

A third copper plate layer 360 may be disposed on the third substrate layer 350. The third copper plate layer 360 may include a line through which electrical signals are transmitted and a general copper plate through which electrical signals are not transmitted.

A fourth substrate layer 370 may be disposed on the third copper plate layer 360. The fourth substrate layer 370 may be a core or a prepreg.

A through hole 381 may be a via which penetrates from the first substrate layer 310 to the fourth substrate layer 370. The first to third copper plate layers 320 to 360 may be electrically connected by using the through hole 381. The through hole 381 may be a via for inserting a component to electrically connect one conductor to another. That is, the through hole 381 may be a hole for inserting a component rather than a general via in which a component is not inserted. The through hole 381 may also be referred to as a through hole via.

A blind via 382 may be a via which penetrates the third substrate layer 350 and the fourth substrate layer 370. The blind via 382 may be a via for connecting an outer layer of a source printed circuit board to one or more adjacent inner layers. A line disposed on the upper part of the fourth substrate layer 370 and the copper plate layer inside the source printed circuit board SPCB may be electrically connected through the blind via 382.

A stack via 383 may be a via which penetrates the third substrate layer 350 and the fourth substrate layer 370. The stack via 383 may be a combination of a first via and a second via. After the first via of the stack via 383 is formed, the second via may be formed on an upper portion of the first via.

The staggered vias 384 and 385 may be vias which electrically connect different layers of the source printed circuit board, but connect the different layers so that they do not directly contact each other. The staggered vias 384 and 385 may be micro vias.

A buried via 386 may be formed in the third substrate layer 350. The buried via 386 may be a via for electrically connecting internal layers of a multilayer source printed circuit board to each other. The second copper plate layer 340 and the third copper plate layer 360 may be electrically connected through the buried via 386.

The source printed circuit board SPCB shown in FIG. 3 is a part of the source printed circuit board SPCB. Therefore, the source printed circuit board SPCB may include four or more substrate layers. The source printed circuit board SPCB may include three or more copper plate layers. The source printed circuit board SPCB may include several types of vias. Additionally, a solder resist ink layer (not shown) may exist on an upper portion and a lower portion of the source printed circuit board SPCB.

The source printed circuit board SPCB may include an electrical line on the top layer, and may transmit electrical signals to the outside through the electrical line.

The source printed circuit board SPCB may include a pad for connecting electrical line inside the source printed circuit board SPCB to the outside of the source printed circuit board SPCB. The pad of the source printed circuit board SPCB may be disposed on one side of the source printed circuit board SPCB.

Hereinafter, a bonding state or a coupling state of the source printed circuit board SPCB through a pad of the source printed circuit board SPCB will be described.

Figure 5:
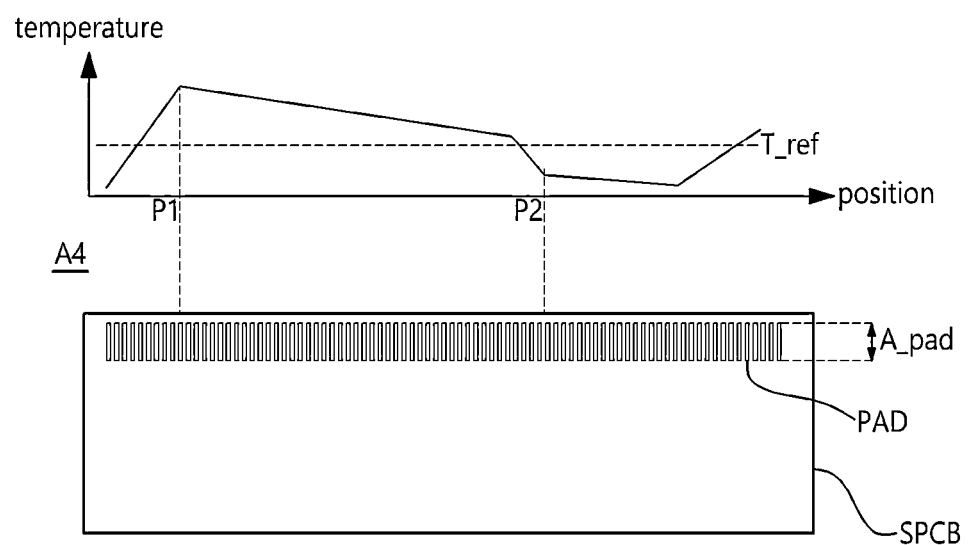

FIGS. 4 and 5 illustrate a bonding state of a source printed circuit board SPCB according to embodiments of the present disclosure.

In FIG. 4, an enlarged view of the second area A2 shown in FIG. 3 is illustrated.

The source film SF may be electrically connected to the display panel 110 through the pad of the display panel 110. Through the pad of the source printed circuit board SPCB, the source film SF may be electrically connected to the source printed circuit board SPCB.

Referring to FIG. 4, a fourth area A4 may be a pad area. As heat is applied to the fourth area A4, the source film SF and the source printed circuit board SPCB may be combined or bonded. An anisotropic conductive film (ACF) may be disposed between the source film SF and the source printed circuit board SPCB. When the heat is applied while an anisotropic conductive film (ACF) is disposed between the source film SF and the source printed circuit board SPCB, the source film SF and the source printed circuit board SPCB may be combined or bonded.

Referring to FIG. 5, a pad area A_pad of the source printed circuit board SPCB is illustrated. A plurality of pads PAD may be disposed in the pad area A_pad. The plurality of pads PAD may be in the form of pins. However, the shape of the pad PAD is not limited to the pin shape.

Referring to FIG. 5, a graph representing the temperature according to the position of the pad area A_pad is illustrated.

Referring to FIG. 5, a reference temperature T_ref is represented in the graph. The source film SF and the source printed circuit board SPCB can be stably bonded only if the temperature of the pad area A_pad is higher than the reference temperature T_ref.

Referring to FIG. 5, there is illustrated a case in which the temperature of a first pad location P1 is higher than the reference temperature T_ref. In the case of the first pad position P1, the source film SF and the source printed circuit board SPCB can be stably bonded. The stable bonding may mean that the source film SF and source printed circuit board SPCB are not separated from each other without external force after the process is completed.

In FIG. 5, the temperature of a second pad location P2 is lower than the reference temperature T_ref according to one embodiment. In the embodiment, the second pad position P2, the source film SF and the source printed circuit board SPCB may be unstably bonded. If the source film SF and the source printed circuit board SPCB are unstably bonded, the source film SF and the source printed circuit board SPCB may be separated without external force after the process is completed.

To solve the problem of unstable bonding between the source film SF and the source printed circuit board SPCB, embodiments of the present disclosure may provide a new type of source printed circuit board SPCB. A source printed circuit board SPCB according to embodiments of the present disclosure may include a plurality of substrate layers, a plurality of copper plate layers, a plurality of vias, and a plurality of through holes. However, for convenience of explanation, only some configurations of the source printed circuit board SPCB may be described. This will be explained in detail below.

Figure 6:
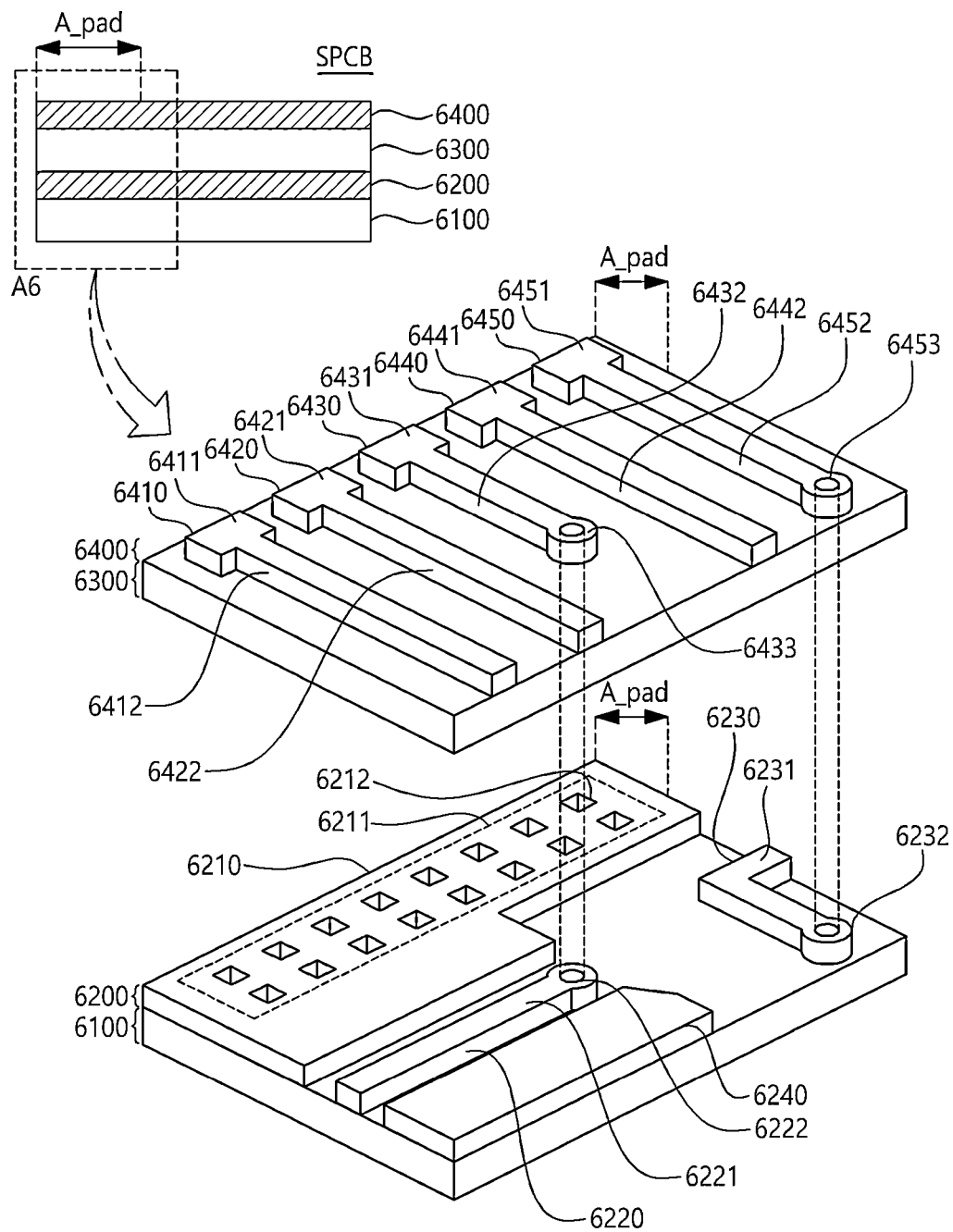
FIG. 6 illustrates a source printed circuit board including a mesh area according to embodiments of the present disclosure.

FIG. 6 illustrates a source printed circuit board SPCB including a mesh area according to embodiments of the present disclosure.

The source printed circuit board SPCB may include a first substrate layer 6100, a first copper plate layer 6200, a second substrate layer 6300, and a second copper plate layer 6400.

The first copper plate layer 6200 may be disposed on the first substrate layer 6100.

The second copper plate layer 6400 may be disposed on the second substrate layer 6300.

Referring to FIG. 6, the source printed circuit board SPCB may include a pad PAD in a pad area A_pad.

Referring to FIG. 6, an enlarged configuration of the source printed circuit board SPCB in a sixth area A6 is illustrated.

The second copper plate layer 6400 may be disposed on the second substrate layer 6300. The second copper plate layer 6400 may include a plurality of external signal lines.

A first external signal line 6410 may include a first pad portion 6411 and a first line portion 6412. As the first line portion 6412 may be electrically connected to the first pad portion 6411, the first line portion 6412 may receive a signal or transmit a signal.

A second external signal line 6420 may include a second pad portion 6421 and a second line portion 6422. As the second line portion 6422 is electrically connected to the second pad portion 6421, the second line portion 6422 may receive a signal or transmit a signal.

A third external signal line 6430 may include a third pad portion 6431, a third line portion 6432, and a third connection hole portion 6433. As the third line portion 6432 is electrically connected to the third pad portion 6431 and the third connection hole portion 6433, the third line portion 6432 may receive a signal or transmit a signal.

A fourth external signal line 6440 may include a fourth pad portion 6441 and a fourth line portion 6442. As the fourth line portion 6442 is electrically connected to the fourth pad portion 6441, the fourth line portion 6442 may receive a signal or transmit a signal.

A fifth external signal line 6450 may include a fifth pad portion 6451, a fifth line portion 6452, and a fifth connection hole portion 6453. As the fifth line portion 6452 is electrically connected to the fifth pad portion 6451 and the fifth connection hole portion 6453, the fifth line portion 6452 may receive a signal or transmit a signal.

The first pad portion 6411, the second pad portion 6421, the third pad portion 6431, the fourth pad portion 6441, and the fifth pad portion 6451 may be formed in the pad area A_pad.

The first copper plate layer 6200 may be disposed on the first substrate layer 6100. After the first copper plate layer 6200 is formed over the entire area of the first substrate layer 6100, the first copper plate layer 6200 may have a patterned shape according to an etching process. Therefore, the first copper plate layer 6200 may include a first copper plate area 6210, a second copper plate area 6220, a third copper plate area 6230, and a fourth copper plate area 6240.

The first copper plate area 6210 may be a copper plate area below the pad area A_pad. The first copper plate area 6210 may include a mesh area 6211. The mesh area 6211 may include a plurality of mesh holes 6212.

The mesh area 6211 may be a ground layer of a source printed circuit board SPCB.

The shape of the mesh hole 6212 may be square. However, the shape of the mesh hole 6212 may be triangular, circular, or other hole shapes.

The second copper plate area 6220 may include a line portion 6221 and a connection hole portion 6222. As the line portion 6221 is electrically connected to the connection hole portion 6222, the line portion 6221 may receive a signal or transmit a signal. The connection hole portion 6222 may be electrically connected to the third connection hole portion 6433. The connection hole portion 6222 may be electrically connected to the third connection hole portion 6433 through a through hole or a via.

The third copper plate area 6230 may include a line portion 6231 and a connection hole portion 6232. As the line portion 6231 is electrically connected to the connection hole portion 6232, the line portion 6231 may receive a signal or transmit a signal. The connection hole portion 6232 may be electrically connected to the fifth connection hole portion 6453. The connection hole portion 6232 may be electrically connected to the fifth connection hole portion 6453 through a through hole or a via.

The fourth copper plate area 6240 may be a copper plate area disposed in an area other than the pad area A_pad.

In the pad area A_pad, there may be disposed the first substrate layer 6100, the first copper plate area 6210, the second substrate layer 6300, and the plurality of pad portions 6411, 6421, 6431, 6441 and 6451.

The first copper plate area 6210 including the mesh area 6211 may be disposed below the plurality of pad portions 6411, 6421, 6431, 6441 and 6451. The plurality of pad portions 6411, 6421, 6431, 6441 and 6451 of the source printed circuit board SPCB may be areas bonded to the source film SF. As heat is supplied to the plurality of pad portions 6411, 6421, 6431, 6441 and 6451, the source printed circuit board SPCB may be combined or bonded with the source film SF. The plurality of pad portions 6411, 6421, 6431, 6441 and 6451 supplied with heat can be stably combined or bonded with the source film SF when the temperature is higher than the reference temperature T_ref.

If there is only a copper plate area which does not include a mesh area below the plurality of pad portions 6411, 6421, 6431, 6441 and 6451, the heat may easily escape through the copper plate area. However, according to the embodiments of the present disclosure, since the first copper plate area 6210 including the mesh area 6211 is disposed under the plurality of pad portions 6411, 6421, 6431, 6441, and 6451, the heat moving through the first copper plate area 6210 may be reduced. That is, the heat supplied to the plurality of pad portions 6411, 6421, 6431, 6441, and 6451 may be concentrated only into the pad portion without escaping to the outside of the pad portion. Accordingly, the temperature of the plurality of pad portions 6411, 6421, 6431, 6441 and 6451 can be maintained above the reference temperature T_ref.

The ratio occupied by the mesh hole 6212 in the mesh area 6211 may vary depending on the design. For example, the proportion of the mesh hole 6212 in the mesh area 6211 may be designed in various ways, such as 44%, 56%, and 64%. As the proportion of the mesh hole 6212 in the mesh area 6211 increases, heat moving through the first copper plate area 6210 can be further reduced. Since the mesh area 6211 is applied in a mesh form, there may be an advantageous effect in terms of expansion or contraction of the source printed circuit board SPCB.

As the mesh hole 6212 becomes closer to the pad portion, heat moving through the first copper plate area 6210 can be further reduced.

Another copper plate layer may be disposed below the first copper plate area 6210 including the mesh hole 6212, and the other copper plate layer may also include a mesh hole. In this case, the heat transferred to the lower part of the pad portion may be further reduced.

Since heat supplied to the pad portion through the mesh area 6211 may not be transferred to other areas, the mesh area 6211 may be called a heat transfer reduction layer.

Figure 7:
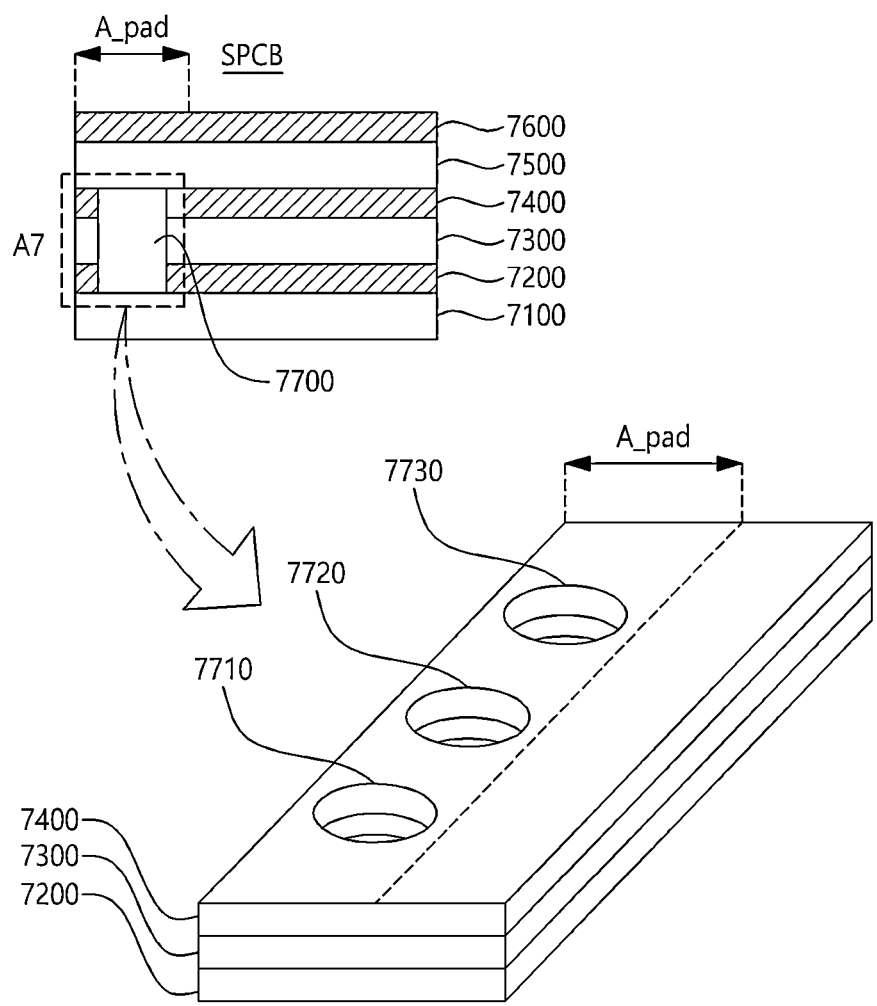
FIGS. 7 and 8 illustrate a source printed circuit board including an air hole according to embodiments of the present disclosure.
Figure 8:
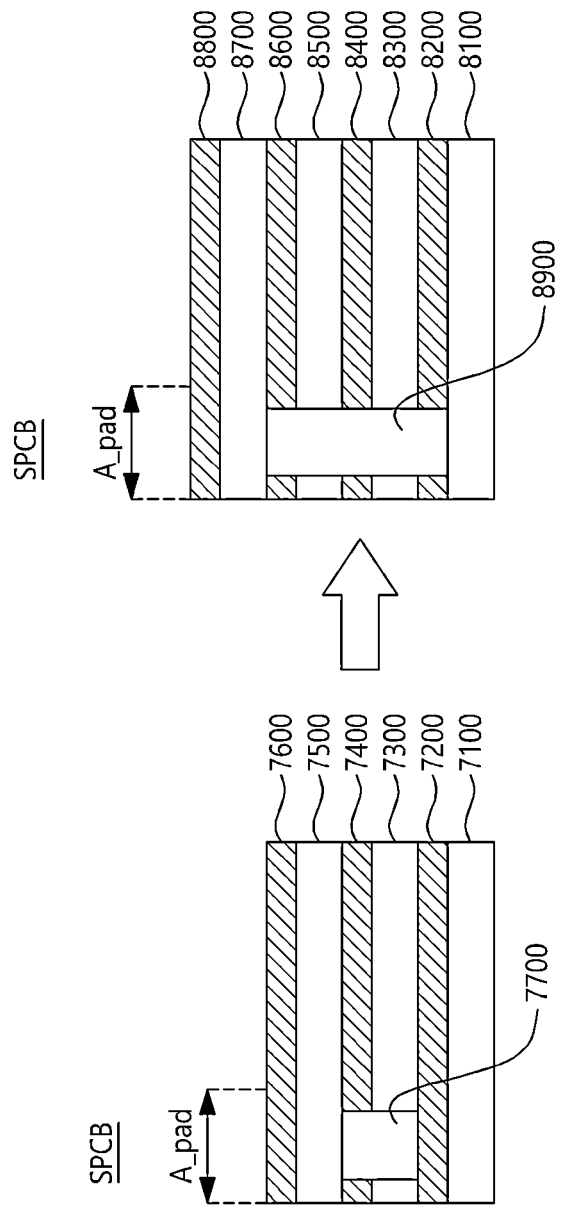

FIGS. 7 and 8 illustrate a source printed circuit board SPCB including an air hole according to embodiments of the present disclosure.

The source printed circuit board SPCB may include a first substrate layer 7100, a first copper plate layer 7200, a second substrate layer 7300, a second copper plate layer 7400, a third substrate layer 7500, and a third copper plate layer 7600.

The first copper plate layer 7200 may be disposed on the first substrate layer 7100.

The second copper plate layer 7400 may be disposed on the second substrate layer 7300.

The third copper plate layer 7600 may be disposed on the third substrate layer 7500.

Referring to FIG. 7, the source printed circuit board SPCB may include a pad PAD in a pad area A_pad.

An air hole 7700 may be disposed between the first copper plate layer 7200 and the second copper plate layer 7400. The air hole 7700 may be disposed at the lower portion or the bottom of a pad portion in the pad area A_pad.

Referring to FIG. 7, an enlarged configuration of the source printed circuit board SPCB in a seventh area A7 is illustrated. Referring to the enlarged seventh area A7 of FIG. 7, each of the plurality of air holes 7710, 7720 and 7730 may be areas penetrating the first copper plate layer 7200 and the second copper plate layer 7400. Each of the plurality of air holes 7710, 7720 and 7730 may be formed in a cylindrical shape, but there is no limit to the shape of the air holes.

If the air hole is not included in the lower portion of the plurality of pad portion, heat may easily escape through the lower part of the pad portion. However, as air holes 7710, 7720 and 7730 are disposed in the lower part of the plurality of pad portions according to embodiments of the present disclosure, heat moving through the lower parts of the pad portions may be reduced. That is, the heat supplied to the plurality of pad portions may be concentrated only in the pad portions without escaping to the outside of the pad parts. Accordingly, the temperature of the plurality of pad portions may be maintained above the reference temperature T_ref.

Referring to FIG. 7, the air holes 7710, 7720 and 7730 are shown as arranged in a row, but the air holes 7710, 7720 and 7730 may be arranged in two or more rows.

Referring to FIG. 7, there are illustrated three air holes 7710, 7720 and 7730 located at the bottom of the pad portion. The air hole may be disposed in the entire lower part of the pad portion. Alternatively, the air hole may be disposed only in some areas requiring an air hole among the lower part of the pad portion.

In FIG. 7, for convenience of explanation, there is illustrated a case in which the air hole penetrates the first copper plate layer 7200 and the second copper plate layer 7400, but there is no limit to the area where the air hole is disposed.

Referring to FIG. 8, the source printed circuit board SPCB may include a first substrate layer 8100, a first copper plate layer 8200, a second substrate layer 8300, a second copper plate layer 8400, a third substrate layer 8500, a third copper plate layer 8600, a fourth substrate layer 8700, and a fourth copper plate layer 8800.

An air hole 8900 may be disposed between the first copper plate layer 8100 and the third copper plate layer 8600.

Although not shown, an air hole may be disposed between the substrate layers. Additionally, the air hole may be disposed between the copper plate layer and the substrate layer.

As the height of the air hole increases, a heat rejection rate may increase. For example, the heat rejection rate of the air hole 8900 shown in FIG. 8 may be higher than the heat rejection rate of the air hole 7700 shown in FIG. 7.

Since the heat supplied to the pad portion through the air hole may not be transferred to other areas, the air hole may be called a heat transfer reduction layer.

Figure 9:
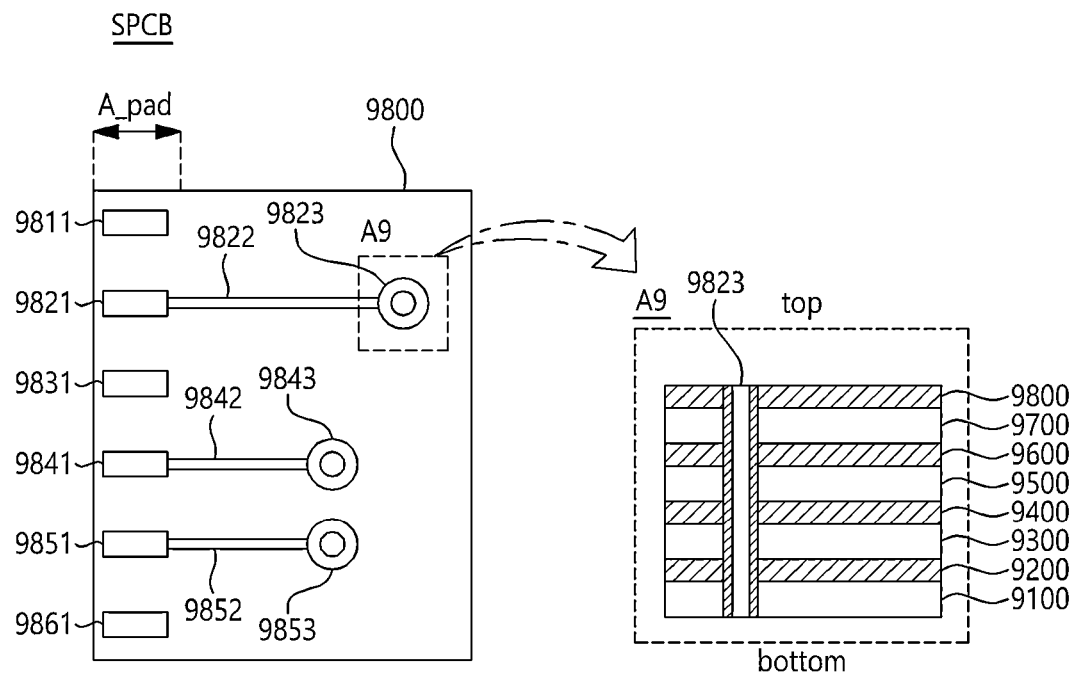
FIG. 9 illustrates a through hole according to embodiments of the present disclosure.

FIG. 9 illustrates a through hole 9823 according to embodiments of the present disclosure.

Figure 10:
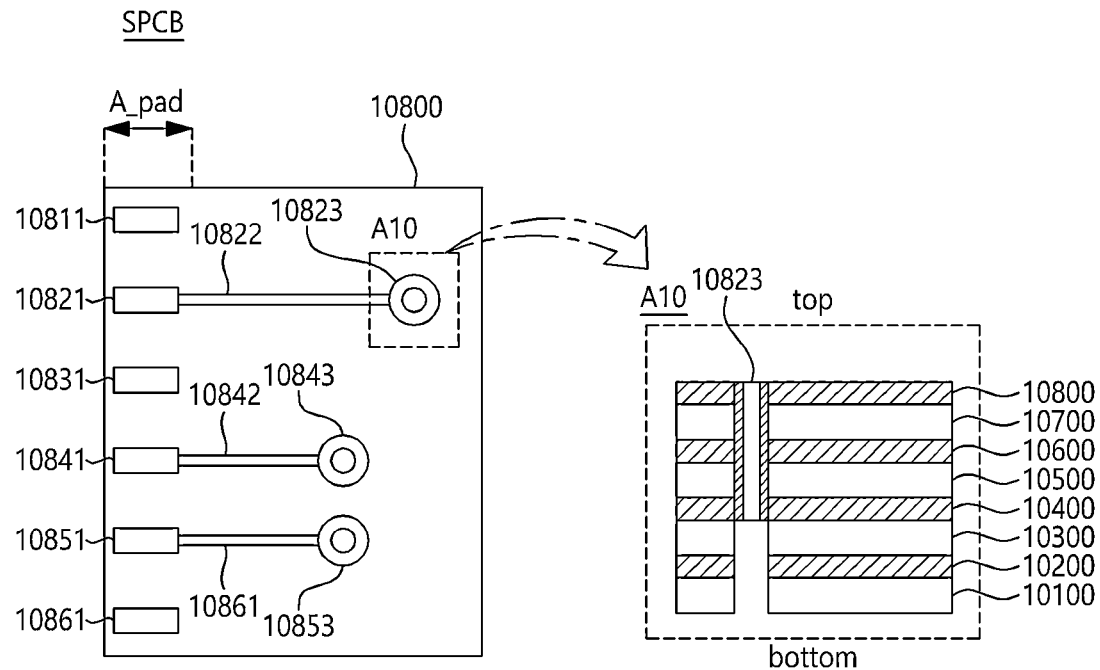
FIGS. 10 and 11 illustrate examples of a back drill through hole according to embodiments of the present disclosure.
Figure 11:
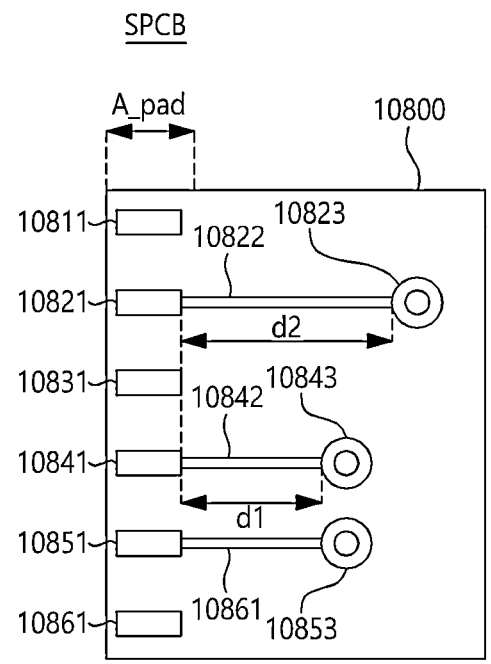

FIGS. 10 and 11 illustrate examples of a back drill through hole 10823 according to embodiments of the present disclosure.

Referring to FIG. 9, the source printed circuit board SPCB may include a first substrate layer 9100, a first copper plate layer 9200, a second substrate layer 9300, a second copper plate layer 9400, a third substrate layer 9500, a third copper plate layer 9600, a fourth substrate layer 9700, and a fourth copper plate layer 9800.

The fourth copper plate layer 9800 may include a plurality of pad portions 9811, 9821, 9831, 9841, 9851 and 9861. A plurality of pad portions may include a first pad portion 9811, a second pad portion 9821, a third pad portion 9831, a fourth pad portion 9841, a fifth pad portion 9851, and a sixth pad portion 9861.

A second line portion 9822 may be disposed between the second pad portion 9821 and a second connection hole portion 9823. The length of the second line portion 9822 may be longer than the length of a fourth line portion 9842.

The fourth line portion 9842 may be disposed between the fourth pad portion 9841 and a fourth connection hole portion 9843. The length of the fourth line portion 9842 may be shorter than the length of the second line portion 9822.

A fifth line portion 9852 may be disposed between the fifth pad portion 9851 and a fifth connection hole portion 9853. The length of the fifth line portion 9852 may be the same as the length of the fourth line portion 9842.

Referring to FIG. 9, there is illustrated an enlarged configuration of the source printed circuit board SPCB in a ninth area A9.

Referring to FIG. 9, the source printed circuit board SPCB may include a through hole 9823. The through hole 9823 may be formed to penetrate the source printed circuit board SPCB. The through hole 9823 is formed to penetrate the source printed circuit board SPCB, so that the plurality of copper plate layers 9200, 9400, 9600 and 9800 may be electrically connected through the through hole 9823. The through hole 9823 may include the second connection hole portion 9823.

Referring to FIG. 10, the source printed circuit board SPCB is illustrated. The source printed circuit board SPCB shown in FIG. 10 may be the same as the source printed circuit board SPCB shown in FIG. 9, except that the source printed circuit board SPCB shown in FIG. 10 has a back drill through hole 10823 in place of the through hole 9823 in FIG. 9. That is, the source printed circuit board SPCB of FIG. 10 may be the same as the source printed circuit board SPCB shown in FIG. 9 except for the back drill through hole 10823. The back drill through hole 10823 may include a second connection hole portion 10823.

Referring to FIG. 10, a source printed circuit board SPCB may include a plurality of substrate layers and a plurality of copper plate layers.

The plurality of substrate layers may include a first substrate layer 10100, a second substrate layer 10300, a third substrate layer 10500, and a fourth substrate layer 10700.

The plurality of copper plate layers may include a first copper plate layer 10200, a second copper plate layer 10400, a third copper plate layer 10600, and a fourth copper plate layer 10800.

The back drill through hole 10823 may have a shape in which the lower end of the through hole is removed. Referring to FIG. 10, a back drill through hole 10823 may be formed between the second copper plate layer 10400 and the fourth copper plate layer 10800. Referring to FIG. 10, the back drill through hole 10823 may not be disposed between the second substrate layer 10300 and the first substrate layer 10100.

Referring to FIG. 9, as heat is supplied to the plurality of pad portions 9811, 9821, 9831, 9841 and 9851, the source printed circuit board SPCB may be combined or bonded with the source film SF. The heat supplied to the second pad portion 9821 may be transferred to the second line portion 9822, and the heat transferred to the second line portion 9822 may be transferred through the second connection hole portion 9823 to the through hole 9823. Since the through hole 9823 may be connected to the plurality of copper plate layers 9200, 9400, 9600 and 9800, the heat transferred to the through hole 9823 may be transferred to the plurality of copper plate layers 9200, 9400, 9600 and 9800. That is, as the heat supplied to the plurality of pad portions 9811, 9821, 9831, 9841, 9851 and 9861 is transferred to the plurality of copper plate layers 9200, 9400, 9600 and 9800, the temperature of the plurality of pad portions 9811, 9821, 9831, 9841, 9851 and 9861 may not be maintained higher than the reference temperature T_ref.

In contrast, referring to FIG. 10, the back drill through hole 10823, from which unnecessary portions of the through hole 9823 have been removed, may be connected to only some of the copper plate layers of the source printed circuit board SPCB. Referring to FIG. 10, the back drill through hole 10823 may not be connected to the first copper plate layer 10200. That is, the back drill through hole 10823 may be connected to the second copper plate layer 10400, the third copper plate layer 10600, and the fourth copper plate layer 10800. Since the back drill through hole 10823 is connected to some of the copper plate layers 10400, 10600 and 10800, the amount of heat transferred to the copper plate layer through the back drill through hole 10823 may be less than a case of the through hole 9823 shown in FIG. 9. That is, the back drill through hole 10823 shown in FIG. 10 transfers less heat to the copper plate layer than the through hole 9823 shown in FIG. 9, so the temperature of the plurality of pad portions 10811, 10821, 10831, 10841, 10851 and 10861 of the source printed circuit board SPCB shown in FIG. 10 may be maintained higher than the reference temperature T_ref. Accordingly, the source printed circuit board SPCB shown in FIG. 10 can be stably combined or bonded with the source film SF.

Meanwhile, referring to FIG. 11, the length d2 of the second line portion 10822 may be longer than the length d1 of the fourth line portion 10842.

Since the length d2 of the second line portion 10822 is longer than the length d1 of the fourth line portion 10842, the heat transferred to the second connection hole portion 10823 may be less than the heat transferred to the fourth connection hole portion 10843. That is, the amount of heat transferred to the connection hole portion may be reduced by changing the length of the line portion to be relatively longer. As the amount of heat transferred to the connection hole portion decreases, the amount of heat transferred through the back drill through hole 10823 or the through hole may decrease. Accordingly, the temperature of the plurality of pad portions 10811, 10821, 10831, 10841, 10851 and 10861 may be maintained higher than the reference temperature T_ref.

Embodiments of the present disclosure described above are briefly described as follows.

Embodiments of the present disclosure may provide a source printed circuit board including a first copper plate layer disposed on a first substrate layer, a second substrate layer disposed on the first copper plate layer, a second copper plate layer disposed on the second substrate layer, a third substrate layer disposed on the second copper plate layer, and a third copper plate layer disposed on the third substrate layer, wherein the third copper plate layer includes a plurality of pad portions disposed in a pad area, wherein the second copper plate layer includes a mesh area corresponding to the pad area, wherein an air hole is disposed in a lower part of the third copper plate layer corresponding to the pad area, and wherein a back drill through hole connected to the second copper plate layer and the third copper plate layer is not connected to the first copper plate layer.

The mesh area may include a plurality of mesh holes.

Each of the plurality of mesh holes may have a square shape.

The first copper plate layer in the pad area may include a mesh area.

The second copper plate layer may be a ground layer.

The air hole may have a cylindrical shape.

The air hole may be an air layer.

The air hole may be disposed between the first substrate layer and the third copper plate layer.

The third copper plate layer may include a pad portion, a connection hole portion, and a line portion between the pad portion and the connection hole portion. The back drill through hole may be connected to the connection hole portion.

The third copper plate layer may include a first pad portion and a second pad portion. A line portion connected to the first pad portion may be longer than a line portion connected to the second pad portion.

The plurality of pad portions may be connected to a source film.

A source driving integrated circuit may be disposed on the source film, and the source film may be connected to a display panel.

Embodiments of the present disclosure may provide a display device including a display panel, a source film connected to the display panel, and a source printed circuit board connected to the source film. The source printed circuit board may include a first copper plate layer disposed on a first substrate layer, a second substrate layer disposed on the first copper plate layer, a second copper plate layer disposed on the second substrate layer, a third substrate layer disposed on the second copper plate layer, and a third copper plate layer disposed on the third substrate layer. In this case, the third copper plate layer may include a plurality of pad portions disposed in a pad area, and the second copper plate layer may include a mesh area corresponding to the pad area. In addition, an air hole may be disposed in a lower part of the third copper plate layer corresponding to the pad area, and a back drill through hole connected to the second copper plate layer and the third copper plate layer may not be connected to the first copper plate layer.

Embodiments of the present disclosure may provide a source printed circuit board including a first copper plate layer disposed on a first substrate layer, a second substrate layer disposed on the first copper plate layer, a second copper plate layer disposed on the second substrate layer, a third substrate layer disposed on the second copper plate layer, and a third copper plate layer disposed on the third substrate layer, wherein the third copper plate layer includes a plurality of pad portions disposed in a pad area, wherein a heat transfer reduction layer is disposed between the first substrate layer and the third copper plate layer, and the heat transfer reduction layer is disposed in the pad area.

The second copper plate layer may include a mesh area corresponding to the pad area, and the mesh area may be included in the heat transfer reduction layer.

An air hole may be disposed in a lower part of the third copper plate layer corresponding to the pad area, and the air hole may be included in the heat transfer reduction layer.

Embodiments of the present disclosure may provide a source printed circuit board including a first copper plate layer disposed on a first substrate layer, a second substrate layer disposed on the first copper plate layer, a second copper plate layer disposed on the second substrate layer, a third substrate layer disposed on the second copper plate layer, and a third copper plate layer disposed on the third substrate layer, wherein a back drill through hole connected to the second copper plate layer and the third copper plate layer is not connected to the first copper plate layer.

The above description and the accompanying drawings provide an example of the technical idea of the present disclosure for illustrative purposes only. Various modifications, additions and substitutions to the described embodiments will be readily apparent to those skilled in the art without departing from the spirit and scope of the present disclosure. In addition, the disclosed embodiments are intended to illustrate the scope of the technical idea of the present disclosure. Thus, the scope of the present disclosure is not limited to the embodiments shown.

What is claimed is:

1. A source printed circuit board comprising:
a first copper plate layer on a first substrate layer;
a second substrate layer on the first copper plate layer;
a second copper plate layer on the second substrate layer;
a third substrate layer on the second copper plate layer; and
a third copper plate layer on the third substrate layer,
wherein the third copper plate layer includes a plurality of pad portions in a pad area,
wherein the second copper plate layer includes a mesh area corresponding to the pad area,
wherein an air hole is in a lower part of the third copper plate layer corresponding to the pad area,
wherein a back drill through hole is connected to the second copper plate layer and the third copper plate layer, but not connected to the first copper plate layer.

2. The source printed circuit board of claim 1, wherein the mesh area includes a plurality of mesh holes.

3. The source printed circuit board of claim 2, wherein each of the plurality of mesh holes has a square shape.

4. The source printed circuit board of claim 1, wherein the first copper plate layer in the pad area includes a mesh area.

5. The source printed circuit board of claim 1, wherein the second copper plate layer is a ground layer.

6. The source printed circuit board of claim 1, wherein the air hole has a cylindrical shape.

7. The source printed circuit board of claim 1, wherein the air hole is an air layer.

8. The source printed circuit board of claim 1, wherein the air hole is between the first substrate layer and the third copper plate layer.

9. The source printed circuit board of claim 1, wherein the third copper plate layer includes a pad portion, a connection hole portion, and a line portion between the pad portion and the connection hole portion,
wherein the back drill through hole is connected to the connection hole portion.

10. The source printed circuit board of claim 1, wherein the third copper plate layer includes a first pad portion and a second pad portion,
wherein a line portion connected to the first pad portion is longer than a line portion connected to the second pad portion.

11. The source printed circuit board of claim 1, wherein the plurality of pad portions are connected to a source film.

12. The source printed circuit board of claim 11, wherein a source driving integrated circuit is disposed on the source film, and the source film is connected to a display panel.

13. A display device comprising:
a display panel;
a source film connected to the display panel; and
a source printed circuit board connected to the source film,
wherein the source printed circuit board comprises:
a first copper plate layer on a first substrate layer;
a second substrate layer on the first copper plate layer;
a second copper plate layer on the second substrate layer;
a third substrate layer on the second copper plate layer; and
a third copper plate layer on the third substrate layer,
wherein the third copper plate layer includes a plurality of pad portions in a pad area,
wherein the second copper plate layer includes a mesh area corresponding to the pad area,
wherein an air hole is in a lower part of the third copper plate layer corresponding to the pad area,
wherein a back drill through hole is connected to the second copper plate layer, and the third copper plate layer is not connected to the first copper plate layer.

14. A source printed circuit board comprising:
a first copper plate layer on a first substrate layer;
a second substrate layer on the first copper plate layer;
a second copper plate layer on the second substrate layer;

a third substrate layer on the second copper plate layer; and a third copper plate layer on the third substrate layer, wherein the third copper plate layer includes a plurality of pad portions in a pad area, wherein a heat transfer reduction layer is between the first substrate layer and the third copper plate layer, and the heat transfer reduction layer is in the pad area, wherein the second copper plate layer includes a mesh area corresponding to the pad area, and wherein the mesh area is included in the heat transfer reduction layer.

15. A source printed circuit board comprising:

a first copper plate layer on a first substrate layer;

a second substrate layer on the first copper plate layer;

a second copper plate layer on the second substrate layer;

a third substrate layer on the second copper plate layer; and a third copper plate layer on the third substrate layer, wherein the third copper plate layer includes a plurality of pad portions in a pad area, wherein a heat transfer reduction layer is between the first substrate layer and the third copper plate layer, and the heat transfer reduction layer is in the pad area, wherein an air hole is in a lower part of the third copper plate layer corresponding to the pad area, and wherein the air hole is included in the heat transfer reduction layer.

16. A source printed circuit board comprising:

a first copper plate layer on a first substrate layer;

a second substrate layer on the first copper plate layer;

a second copper plate layer on the second substrate layer;

a third substrate layer on the second copper plate layer; and a third copper plate layer on the third substrate layer, wherein a back drill through hole is connected to the second copper plate layer, and the third copper plate layer is not connected to the first copper plate layer, wherein the third copper plate layer includes a pad portion, a connection hole portion, and a line portion between the pad portion and the connection hole portion, and wherein the back drill through hole is connected to the connection hole portion.

* * * * *